United States Patent
Chang Chien et al.

(10) Patent No.: US 10,507,498 B2
(45) Date of Patent: Dec. 17, 2019

(54) APPARATUS FOR PARTICLE CLEANING

(71) Applicant: TAIWAN SEMICONDUCTOR MANUFACTURING COMPANY LTD., Hsinchu (TW)

(72) Inventors: Ying-Hsueh Chang Chien, Hsinchu (TW); James Jeng-Jyi Hwang, Hsin-Chu County (TW); Chi-Ming Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 231 days.

(21) Appl. No.: 15/183,124

(22) Filed: Jun. 15, 2016

(65) Prior Publication Data

US 2017/0361361 A1    Dec. 21, 2017

(51) Int. Cl.
| B08B 7/02 | (2006.01) |
| H01L 21/67 | (2006.01) |
| B24B 37/34 | (2012.01) |
| B08B 3/12 | (2006.01) |

(52) U.S. Cl.
CPC ............. B08B 7/028 (2013.01); B08B 3/12 (2013.01); B24B 37/34 (2013.01); H01L 21/67017 (2013.01); H01L 21/67051 (2013.01)

(58) Field of Classification Search
CPC ........... B08B 7/04; B08B 1/001; B08B 1/007; B08B 3/12; B08B 7/028; B08B 7/02; B24B 37/34; H01L 21/67017; H01L 21/67051

See application file for complete search history.

(56) References Cited

U.S. PATENT DOCUMENTS

| 6,766,813 | B1 * | 7/2004 | Sayka | B08B 3/02 134/148 |
|---|---|---|---|---|
| 2003/0116176 | A1 * | 6/2003 | Rothman | B01J 3/008 134/1.3 |
| 2005/0003737 | A1 * | 1/2005 | Montierth | A61B 8/546 451/5 |
| 2010/0108093 | A1 * | 5/2010 | Peng | H01L 21/67051 134/1.3 |
| 2013/0239989 | A1 * | 9/2013 | Lu | B08B 7/026 134/1 |

\* cited by examiner

*Primary Examiner* — Robert J Scruggs
(74) *Attorney, Agent, or Firm* — WPAT, P.C., Intellectual Property Attorneys; Anthony King

(57) ABSTRACT

The present disclosure provides a particle cleaning apparatus. The apparatus comprises an acoustic wave generator configured to apply an acoustic wave to particles external to the acoustic wave generator. The apparatus also includes a removing module configured to remove the applied particles.

20 Claims, 12 Drawing Sheets

APPARATUS FOR PARTICLE CLEANING

BACKGROUND

Manufacturing of silicon chips or wafers typically involves a myriad of processing steps, such as surface conditioning, film deposition, photolithography, film patterning, etching, etc. In most of the processes, residual particles or foreign contaminants may be found on the wafer surface. However, the cleanliness of the wafer surface must be maintained and avoiding contaminants and damage ensures a high yield rate. As the industry trend continues to focus on decreasing device size, the line width of the devices is scaled down and the device count is increased accordingly. The impact of the undesired particles left on the semiconductor chips may be more prominent since the particle size is considered relatively large compared to the shrinking feature size of the device. Thus, an efficient particle cleaning structure is needed for maintaining the surface quality of wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
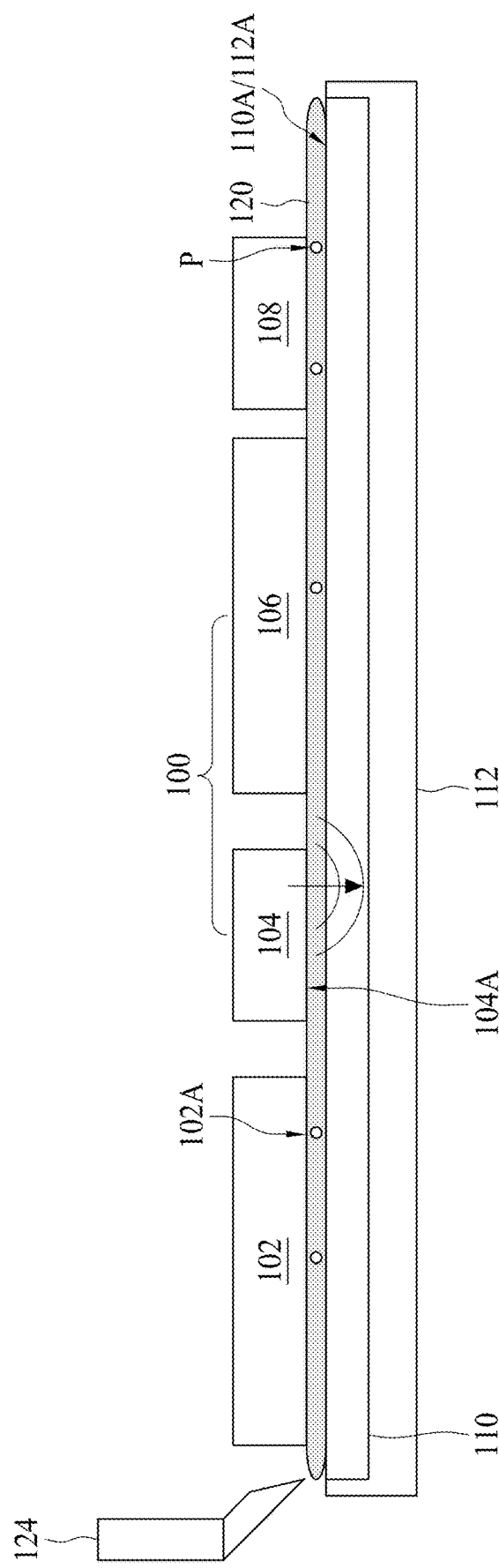
FIGS. 1A and 1B are schematic views of a semiconductor manufacturing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a particle cleaning apparatus and a particle cleaning system are proposed. The particles residing on the surface of a polishing platen or a workpiece, such as semiconductor substrate, are vibrated or caused to move by an acoustic wave applied to the surface. In addition, a removing force, such as a suction force, removes particles or fluids containing the particles. Effectively, the acoustic wave and the removing force cooperatively prevent the particles from attaching to or residing on the surface. The proposed mechanism can also eliminate the problem of particle re-deposition on the surface if particles are not completely cleaned off.

FIG. 1A is a schematic view of a semiconductor manufacturing system 10 in accordance with some embodiments of the present disclosure. In an embodiment, the semiconductor manufacturing system 10 is used in a polishing operation such as a chemical mechanical polishing (CMP). The semiconductor manufacturing system 10 comprises a platen 112 and a pad conditioner 108 disposed over a surface 112A of the platen 112. A semiconductor substrate 102, is provided and disposed on the surface 112A of the platen 112.

In some embodiments, the semiconductor substrate 102 is semiconductor chip or wafer. The semiconductor substrate 102 includes an elementary semiconductor such as silicon or germanium in crystal, polycrystalline, or an amorphous structure; a compound semiconductor including gallium arsenic, gallium phosphide, silicon carbide, indium phosphide, indium arsenide, and/or indium antimonide; an alloy semiconductor including SiGe, GaAsP, AlGaAs, AlInAs, GaInAs, GaInP, and/or GaInAsP; any other suitable material; and/or combinations thereof. Furthermore, the semiconductor substrate 102 may be a semiconductor on insulator, such as a silicon-on-insulator (SOI), or a thin film transistor (TFT). In some examples, the semiconductor substrate 102 includes a doped epitaxy layer or a buried layer. In other examples, the semiconductor substrate 102 has a multilayer compound structure.

In an embodiment, the semiconductor substrate 102 may include various doping regions depending on design specifications as known in the art. The doped regions may be doped with P-type or N-type dopants. The semiconductor substrate 102 may further include various active regions and features on an active surface 102A. For example, the active regions may be configured for an N-type metal-oxide-semiconductor transistor device (NMOS) and other active regions configured for a P-type metal-oxide-semiconductor transistor device (PMOS). In addition, the semiconductor substrate 102 may include interconnect structures, vias, bond pads and other features.

The semiconductor manufacturing system 10 is configured to remove excess materials from one or more deposited layers of the semiconductor substrate 102. The platen 112 comprises a polishing pad 110 used to level the top surface 102A for the semiconductor substrate 102. In one embodiment, the polishing pad 110 may comprise a polishing head mounted on its top surface 110A, which is the top surface 112A of the platen. The semiconductor substrate 102 is positioned and contacts with a polishing layer of the polishing pad 110. The top surface 102A is facing the platen 112. In an embodiment, a wafer carrier (not separately shown) is provided to hold the semiconductor substrate 102 and configured to provide a force to press the semiconductor substrate 102 against the platen 112.

To enhance polishing of the semiconductor substrate 102, the platen 112 and the semiconductor substrate 102 are moved along predetermined directions and velocities. The platen 112 may be rotated along with the rotation of the platen 112. In another embodiment, the semiconductor substrate 102 is rotated by the wafer carrier. In some embodiments, the platen 112 and the semiconductor 102 are moved with respective angular velocities. The platen 112 and the semiconductor 102 are configured to move and keep a relative distance from each other.

In an embodiment, the polishing pad 110 may comprise a rough surface in order to facilitate the polishing process. In some embodiments, the polishing layer comprises a porous surface. In alternative embodiments, the polishing layer may comprise fibers or is formed with a porous structure. In addition, the polishing layer is configured to retain protruding grits. The grits retained in the polishing layer may be fine and highly abrasive. When the platen 112 and the semiconductor substrate 102 are contacted and moved relative to each other, the grits break down substances on the surface 102A of the semiconductor substrate 102 due to a higher hardness of the grits. Moreover, a contributing relative movement between the semiconductor substrate 102 and the platen may help the polishing performance.

In a CMP operation, a polishing fluid 120 is applied on the platen 112. The fluid 120 may be slurry or other polishing medium. The fluid 120 is supplied onto the surface 112A of the platen 112. In an embodiment, the fluid 120 fills the gap between the semiconductor substrate 102 and platen 112. In an embodiment, the fluid 120 may contain deionized (DI) water or other chemicals. The fluid 120 may also include abrasive grains to facilitate the polishing performance.

In an embodiment, the fluid 120 is provided by a fluid dispenser 124. In an embodiment, the fluid dispenser 124 comprises an outlet approximate to the surface 112A. In an embodiment, the fluid dispenser 124 includes a nozzle for dispensing the fluid 120.

The pad conditioner 108 is disposed over the platen 112. The pad conditioner 108 is configured to revive the surface 110A of the polishing pad 110 in order to recover the polishing capability of the polishing pad 110. In an embodiment, the pad conditioner 108 is configured to keep the fibers erect and make the surface 110A as flexible as possible. In an embodiment, the pad conditioner 108 is configured to ensure enough openings or pores are available near the surface 110A in order to accommodate abrasive grains from the fluid 120. In an embodiment, the pad conditioner 108 includes a substrate layer holding abrasive grains. The abrasive grains may be made of diamond or cubic boron nitride.

The polishing performance of the semiconductor manufacturing system 10 is determined by several contributing factors, for example, the mechanical forces exerted by the platen 112 or the chemical forces provided by the slurry chemicals. In addition, the dislodged grains from the polishing pad 110 or the pad conditioner 108 may not be firmly held, and thus may drop onto the surface 102A of the semiconductor substrate 102. Those grains or foreign particles may be attached or redeposited to the surface 102A and adversely impact the functions of the circuits on the semiconductor substrate 102. Further, an amount of the removed materials from the top surface 102A of the semiconductor substrate 102 may produce residual particles if they are not carried away by the fluid 120 or another cleaning medium. The situation may be even worse if the rotation velocity of the semiconductor substrate 102 or the platen 112 is low. More particles may accumulate around the surface 102A due to a slow movement. Moreover, such residual particles may reside again on the semiconductor substrate 102 after they are lifted off of the surface 102A. The re-deposition may lead to undesired short circuit, open circuit or property degradation. The wafer yield rate is decreased accordingly.

In the present disclosure, a particle cleaning apparatus 100 is proposed to effectively remove the residual particles during a polishing or cleaning process. The particle cleaning apparatus 100 is disposed around the platen 112 and the semiconductor substrate 102. The particle cleaning apparatus 100 comprises an acoustic wave generator 104 and a removing module 106.

The acoustic wave generator 104 is configured to apply an acoustic wave which is capable of displacing residual particles P off of a surface of a workpiece with respect to the particle cleaning apparatus 100, such as the surface 112A or the surface 102A. In an embodiment, the acoustic wave generator 104 is configured to vibrate the platen 112 or a work piece such as the semiconductor substrate 102. In an embodiment, the acoustic wave generator 104 causes the particles P to move and leave the surface 112A or the surface of the semiconductor substrate 102. In an embodiment, the acoustic wave generator 104 is configured to generate an acoustic wave with ultrasonic frequencies above sonic waves. For example, the acoustic wave is in a range from about 20 kilohertz to about 200 kilohertz. In an embodiment, the acoustic wave generator 104 is configured to generate an acoustic wave with megasonic frequencies in a range from about 0.8 megahertz to about 2 megahertz.

In an embodiment, the acoustic wave generator 104 may apply an acoustic streaming effect within a flow in the fluid 120. The flow may help move the particles P off of the surface 112A. In addition, the acoustic wave generator 104 may produce a cavitation or bubble effect in order to facilitate the cleaning. In an embodiment, the acoustic wave generator 104 is applied on the particles and configured to move the particles P away from the surface 112A. In an embodiment, the acoustic wave is applied to the fluid 120 and the particles P included in the fluid 120. The acoustic wave transmits energies via the fluid 120 and helps move the residual particles P included in the fluid 120. In an embodiment, the particles P may be directed to move along a propagation direction of the acoustic wave, such as a direction along a normal line substantially perpendicular to the surface 112A or 102A. In another embodiment, the particles P may be directed to move along a direction substantially parallel to the surface 112A or 102A.

The acoustic wave generator 104 can be constructed in many ways. In an embodiment, the acoustic wave generator 104 comprises an acoustic transducer. In some embodiments, the acoustic wave generator 104 may be composed of a piezoelectric materials sandwiched by a front metal and a back metal, and generate an acoustic wave with the inverse piezoelectric effect. In some other embodiments, the acoustic wave generator 104 may be formed of a magnet and a coil where the acoustic wave is generated following the principle of electromagnetism. In an embodiment, the acoustic wave generator 104 comprises an output face in a surface 104A substantially perpendicular to a propagation direction of the generated acoustic wave. In an embodiment, the output face is in contact with the surface 112A of the platen 112 and the acoustic wave is transmitted through the platen 112.

Referring to FIG. 1A, the acoustic wave generator 104 is in contact with the surface 112A of the platen 112. In another embodiment, the acoustic wave generator 104 is close to yet separate from the platen 112. In the present embodiment, the fluid 120 may be dispensed between the output face of the acoustic wave generator 104 and the platen 112 in order to facilitate transmission of the acoustic wave. In an embodiment, the fluid 120 fills a gap between the semiconductor substrate 102 and the platen 112. In an embodiment, a height for the gap or the filled fluid 120 between the semiconductor substrate 102 and the platen 112 is determined as between about 1 mm and about 5 mm. In an embodiment, a height for the gap or the fluid 120 is determined as between about 0.5 mm and about 1 mm.

In an embodiment, a cleaning fluid other than the polishing fluid 120 may be used alternatively and dispensed between the acoustic wave generator 104 and the platen 112. The cleaning fluid may not contain polishing grains or chemicals. In an embodiment, the cleaning fluid may compose of cleaning liquid such as DI water. In an embodiment, the cleaning fluid may be mixed with the polishing fluid 120 in cleaning the surface 102A or 112A.

The removing module 106 is disposed over the surface 112A of the platen 112. The removing module 106 is configured to remove residual particles P left on the surface 112A. In an embodiment, the removing module 106 is configured to remove fluid 120 containing the residual particles P. In an exemplary design, the removing module 106 draws or carries the fluid 120 away from the surface 112A without contacting the surface 112A. The removing module 106 may be configured to suck the residual particles P and the fluid 120 or the cleaning fluid off of the surface 112A.

Figure 1B:
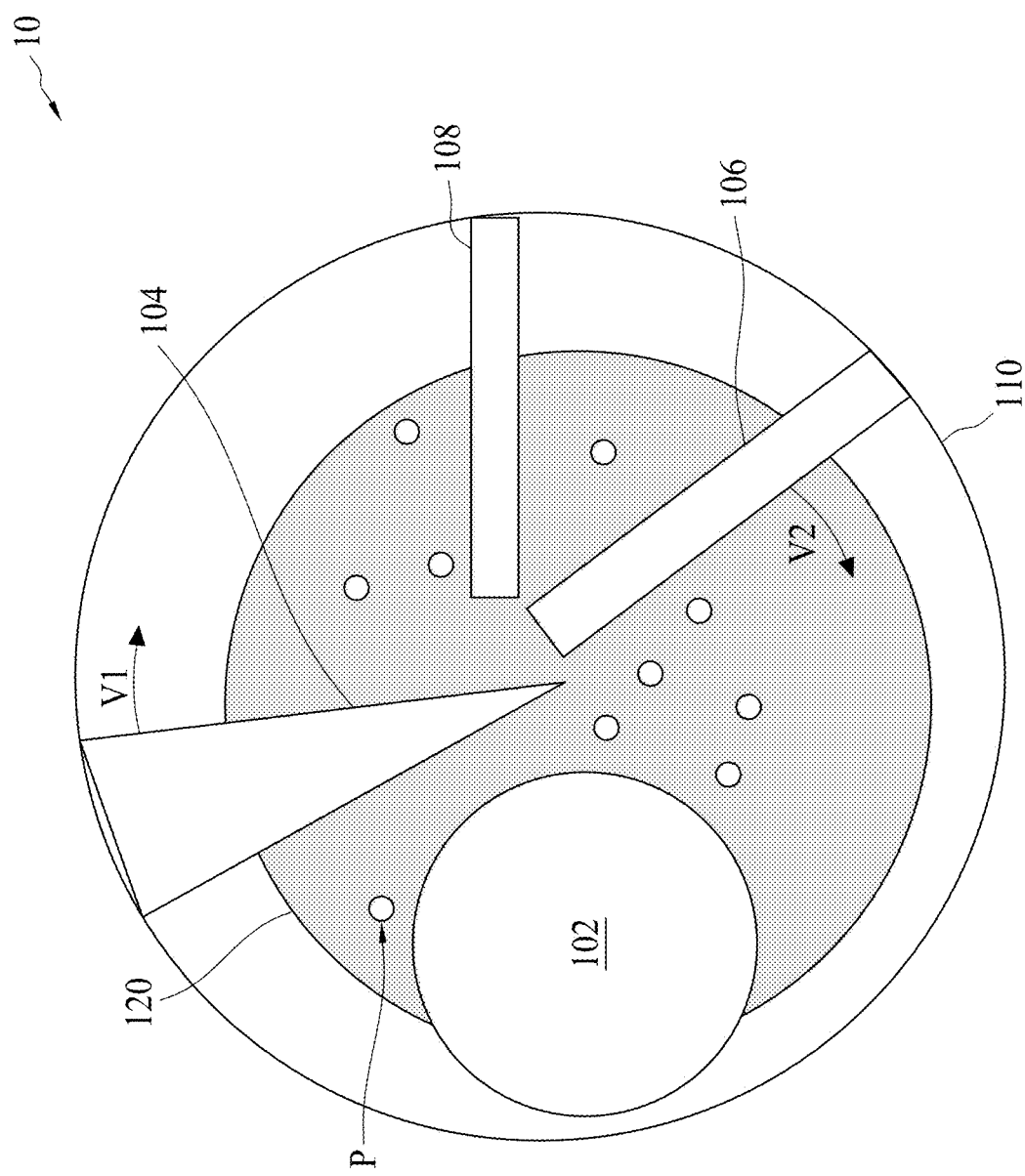

FIG. 1B is a schematic top view of the semiconductor manufacturing system 10 in accordance with some embodiments of the present disclosure. The semiconductor substrate 102, the acoustic wave generator 104, the removing module 106 and the pad conditioner 108 are separate from one another over the surface 112A of the platen 112. In operation, the semiconductor substrate 102, the acoustic wave generator 104, the removing module 106 and the pad conditioner 108 may be alternatively disposed into place with a determined cycle. The polishing operation and the platen cleaning operation may be performed in-situ accordingly. In an embodiment, at least one of the semiconductor substrate 102, the acoustic wave generator 104, the removing module 106 and the pad conditioner 108 scans across the surface 112A and rotates over the surface 112A with respective angular velocities. For example, the acoustic wave generator 104 rotates with an angular velocity V1 while the removing module 106 rotates with an angular velocity V2. In some embodiments, the acoustic wave generator 104 and the removing module 106 rotate with substantially equal angular velocity, i.e., V1=V2. In an embodiment, the semiconductor substrate 102 further comprises a self-revolving movement exerted by the wafer carrier when it is rotated.

Figure 2A:
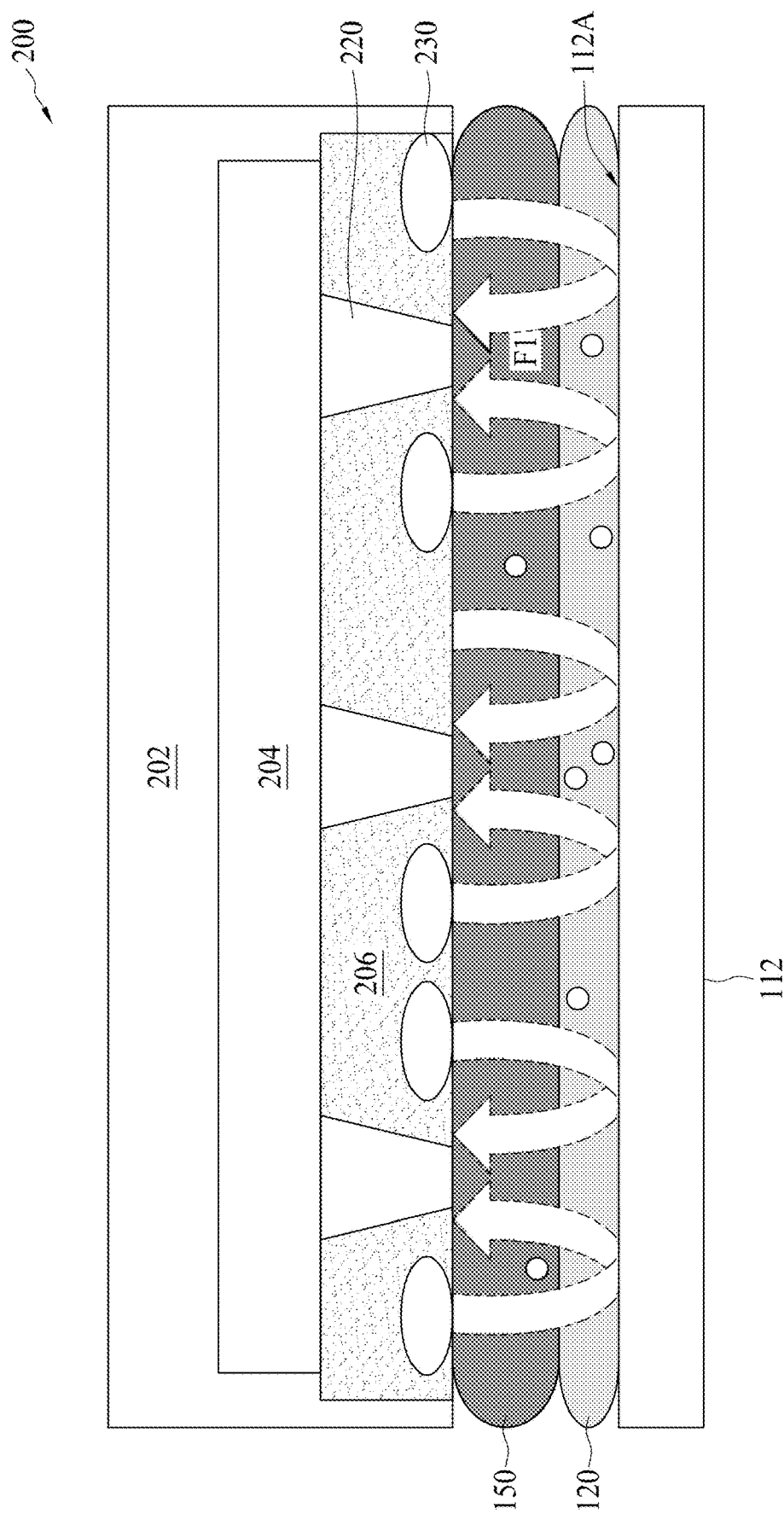
FIGS. 2A and 2B are schematic views of a removing module in accordance with some embodiments of the present disclosure.
Figure 2B:
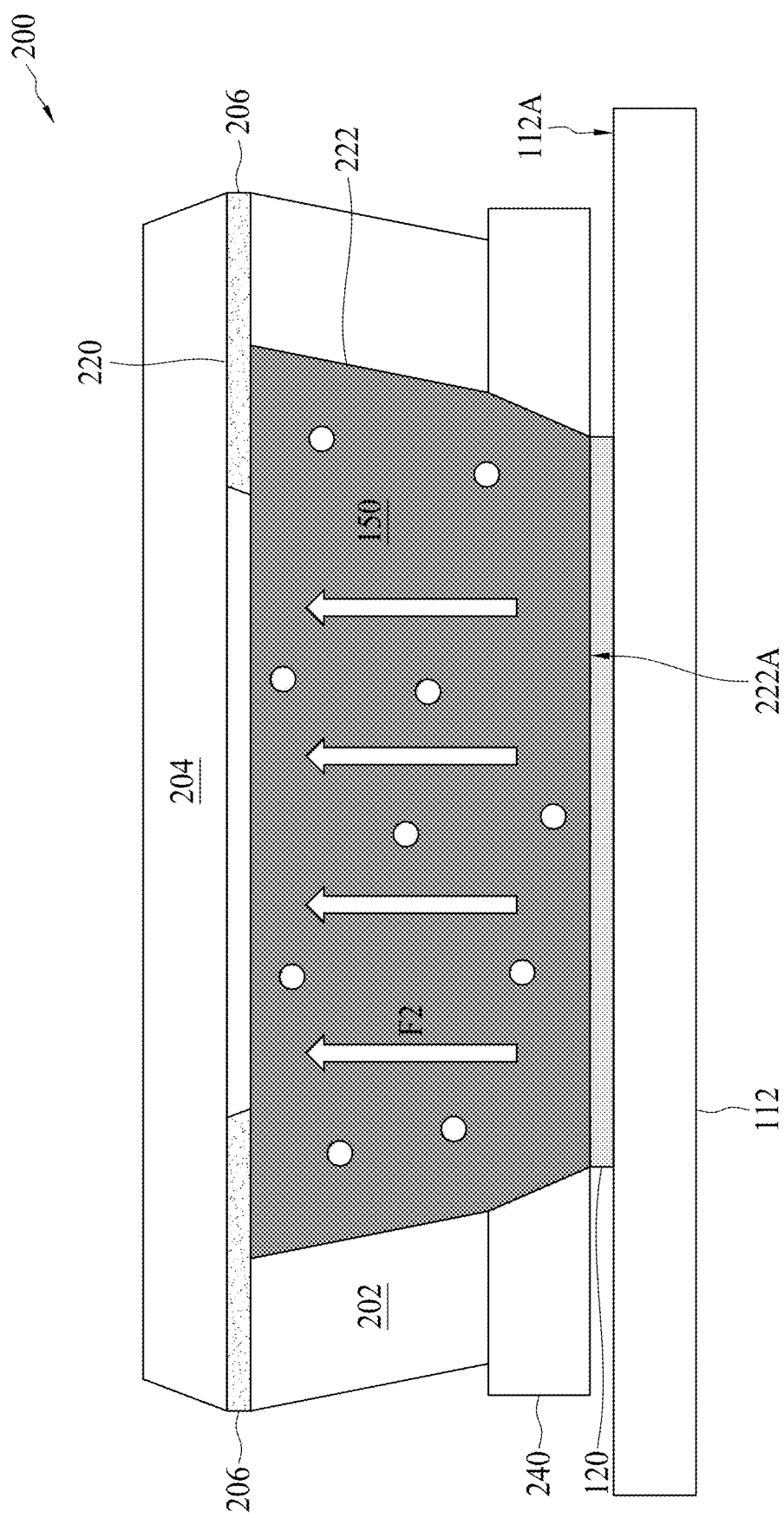

FIGS. 2A and 2B are schematic views of a removing module 200 in accordance with some embodiments of the present disclosure. Referring to FIG. 2A, the removing module 200 comprises a support 202, a suction unit 204, and a layer 206. The layer 206 comprises several vias 220 and apertures 230.

In an embodiment, the fluid 120 is filled between the removing module 200 and the platen 112. The suction unit 204 is configured to generate a suction force to draw back the fluid 200 along with the residual particles P. In an embodiment, the suction unit 204 may comprise a pump, such as a centrifugal pump, a magnetic drive pump, a vertical column pump, a submersible pump or a positive displacement pump.

In an embodiment, the polishing fluid 120 may be dispensed near the surface 112A of the platen 112. In an embodiment, the removing module 200 is configured to supply a cleaning fluid 150 through the layer 206. In some embodiments, the apertures 230 may be disposed adjacent to the vias 220. The apertures 230 is configured to spray the cleaning fluid 150 onto the surface 112A and the vias 220 are configured to pass the particles drawn to the suction unit 214. Although the cleaning fluid 150 and the polishing fluid 120 are separately illustrate, in some embodiments both of the fluid 120 and the fluid 150 may be mixed. The particles P may be included in either the polishing fluid 120 or the cleaning fluid 150. In an embodiment, only one of the cleaning fluid 150 or the polishing fluid 120 is present as the cleaning medium for carrying the particles.

A flow F1 illustrated in FIG. 2A is established between the platen 112 and the removing module 200. In an embodiment, the flow F1 follows a substantially circular direction from one of the apertures 230 to one of the vias 220. As a result, the residual particles P are taken away from the surface 112A and drawn into the suction unit 204 through the vias 220. In an embodiment, the particles P are moved off of the surface 112A in a direction substantially perpendicular to the surface 112A.

Referring to FIG. 2B, the removing module 200 comprises a support 202, a suction unit 204, a layer 206, a via 220 and a retention cuff 240. In an embodiment, a cavity 222 is formed within the support 202 and the suction unit 204. In an embodiment, the cavity 222 is configured to receive the cleaning fluid 150. In an embodiment, the cavity 222 has an opening 222A facing the platen 112. The cavity 222 can be regarded as a fluid channel along which the fluid 150 or the fluid 120 is directed from the opening to the suction unit 204. In an embodiment, the cleaning fluid 150 may be supplied to the cavity 222 by a separate source near a bottom side of the removing module 200. The fluid 120 or the fluid 150 is drawn into the suction unit 204 in a fluid flow F2. In an embodiment, the flow F2 follows a linear direction pointing from the opening 222A of the cavity 222 towards the suction unit 204. It can be observed that the direction of the fluid flow F2 is substantially the same as the direction along which the particles P are carried away from the surface 112A.

The retention cuff 240 is disposed adjacent to the bottom side of the removing module 200. The retention cuff 240 is configured to prevent the fluid 120 or the fluid 150 from overflowing beyond the opening area of the cavity 222. In some embodiments, the retention cuff 240 comprises air inlets and outlets facing toward the surface 112A such that an air barrier or gas knife is formed accordingly at the gap region between the surface 112A and the retention cuff 240. In an embodiment, the retention cuff 240 comprises a round shape or polygon shape from a bottom view. In an embodiment, the opening 222A is defined and surrounded by the retention cuff 240. In an embodiment, the retention cuff 240 may comprise apertures (not separately shown) similar to the apertures 230 in FIG. 2A that are configured to supply the cleaning fluid 150.

Figure 3A:
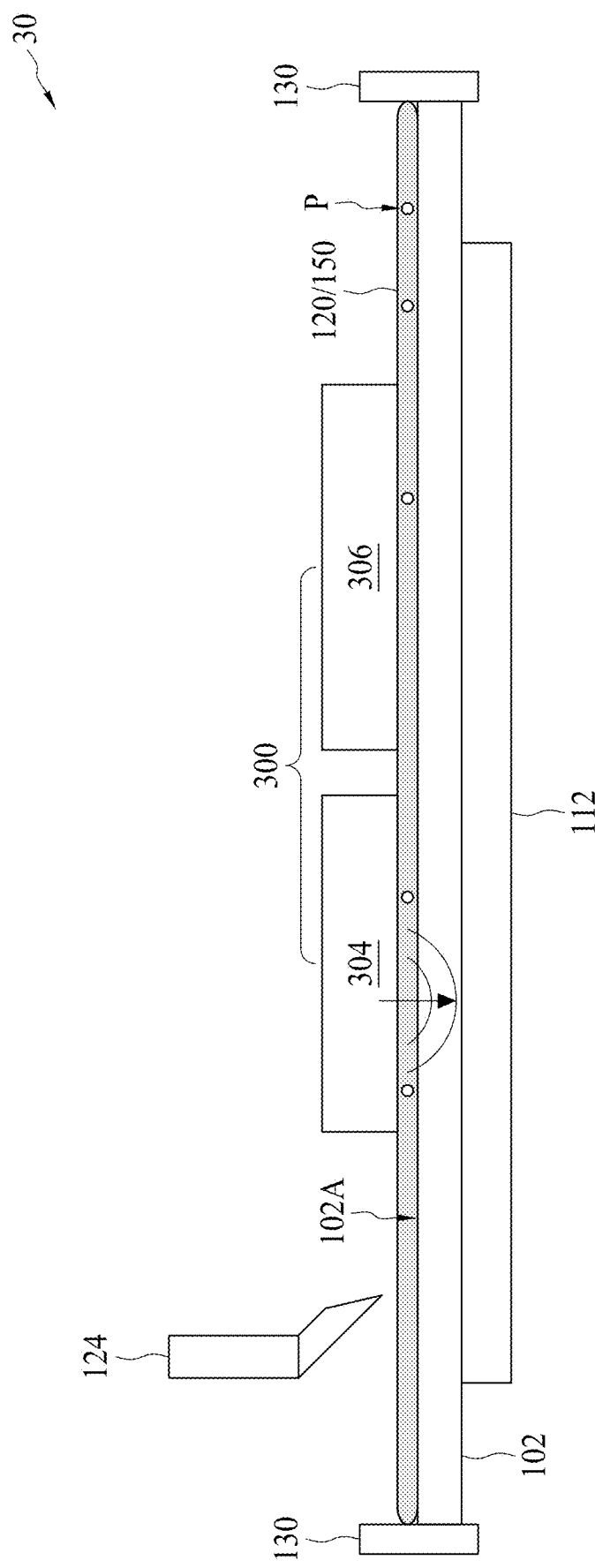
FIGS. 3A and 3B are schematic views of a semiconductor manufacturing system in accordance with some embodiments of the present disclosure.
Figure 3B:
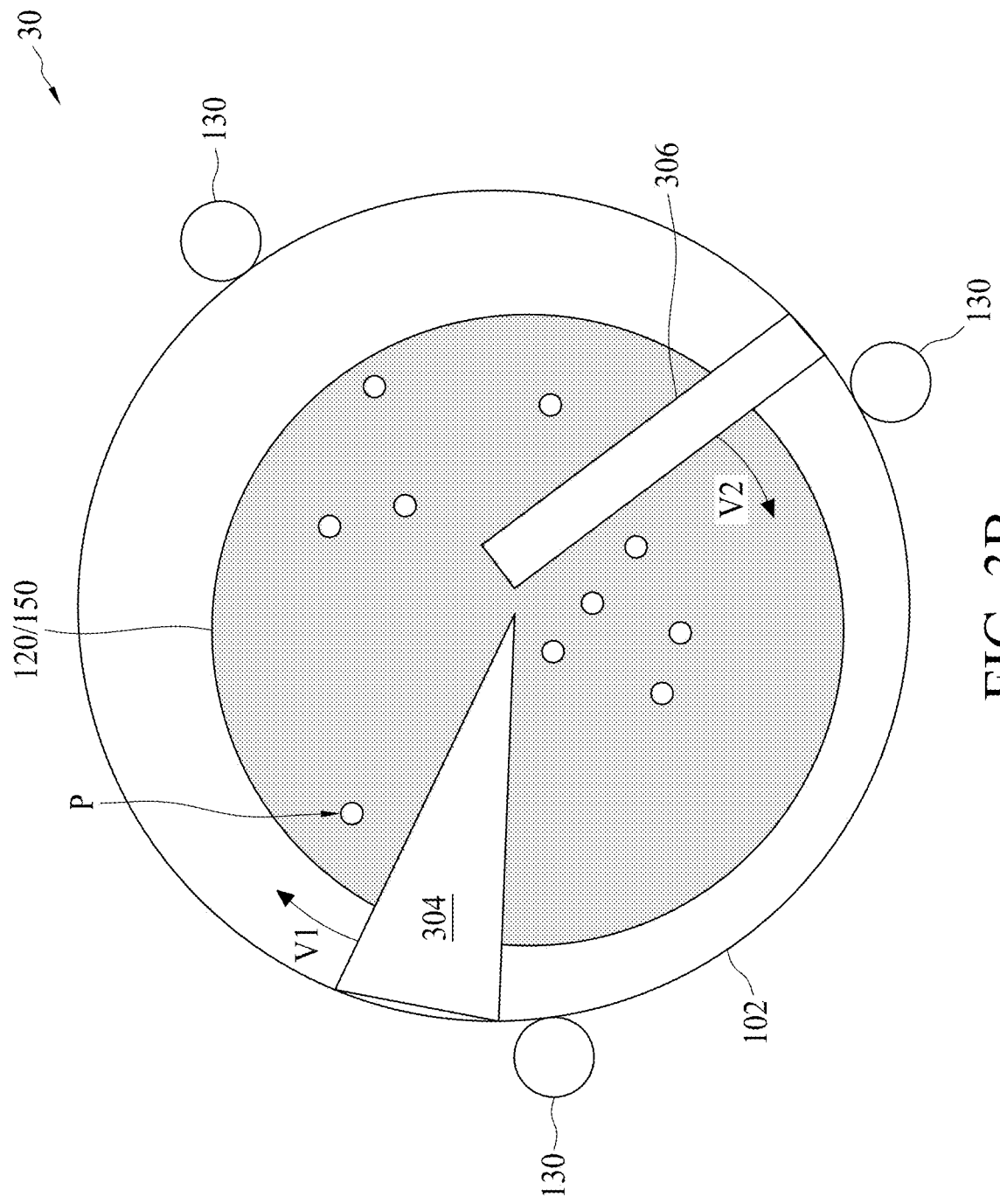

FIGS. 3A and 3B are schematic views of a semiconductor manufacturing system 30 in accordance with some embodiments of the present disclosure. The semiconductor manufacturing system 30 comprises a carrier 112, several carrier pins 130 and a particle cleaning apparatus 300. The carrier 112 supports the semiconductor substrate 102. The carrier pins 130 hold the semiconductor substrate 102 in place. In an embodiment, the carrier pins 130 provide a rotational force to rotate the semiconductor substrate 102.

The particle cleaning apparatus 300 comprises an acoustic wave generator 304 and a removing module 306. The acoustic wave generator 304 and the removing module 306 are opposite to the workpiece 102. Referring to FIG. 1A and FIG. 3A, the particle cleaning apparatus 300 is configured to clean undesired particles P that are left after semiconductor manufacturing operations or that appear when the wafer is exposed to the atmosphere. Different from the particle cleaning apparatus 100 used against the platen 112, the particle cleaning apparatus 300 is utilized for cleaning a surface of a workpiece such as the semiconductor surface 102. In an embodiment, a fluid, for example the polishing fluid 120, the cleaning fluid 150 or both, is dispensed between the surface 102A and the particle cleaning apparatus 300.

FIG. 3B is a schematic top view of the semiconductor manufacturing system 30 in accordance with some embodiments of the present disclosure. The acoustic wave generator 304 and the removing module 306 are separately disposed over the surface 102A of the semiconductor substrate 102. In operation, the acoustic wave generator 304 and the removing module 306 may be alternatively disposed in place with a determined cycle. In an embodiment, the acoustic wave generator 304 and the removing module 306 scan across the surface 102A and rotate thereon with respective angular velocities V1 and V2.

Figure 4A:
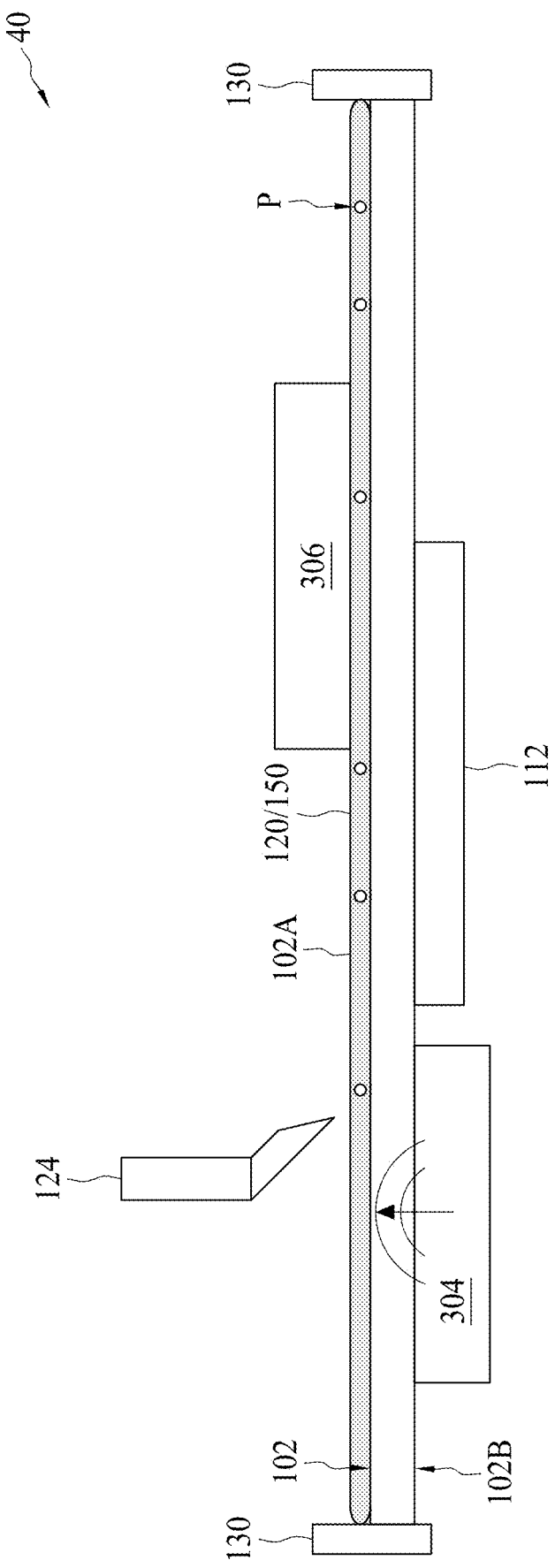
FIGS. 4A and 4B are schematic views of a semiconductor manufacturing system in accordance with some embodiments of the present disclosure.
Figure 4B:
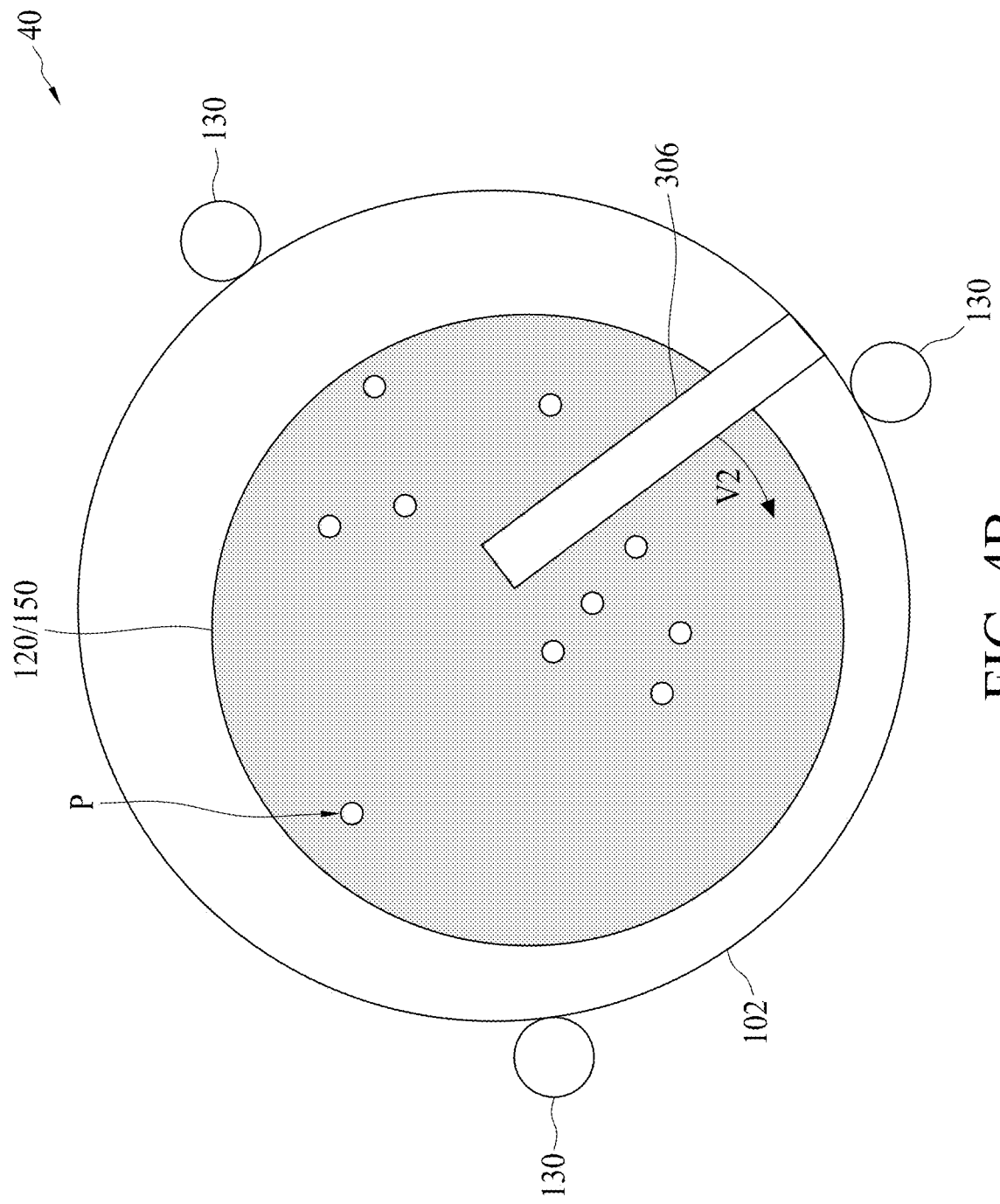

FIGS. 4A and 4B are schematic views of a semiconductor manufacturing system 40 in accordance with some embodiments of the present disclosure. Referring to FIG. 3A and FIG. 4A, the acoustic wave generator 304 is disposed on a bottom side 102B opposite to the top side 102A. The acoustic wave generated by the acoustic wave generator 304 can be applied to the top surface 102A through the intermediate materials of the semiconductor substrate 102. Therefore, the installation flexibility of the particle cleaning apparatus 300 can be increased without degrading the cleaning performance. In an embodiment, the fluid 150 may be dispensed between the acoustic wave generator 304 and the bottom surface 102B in order to facilitate the transmission of the acoustic wave. In an embodiment, the acoustic wave generator 304 is disposed on a back side of the carrier 112. The acoustic wave is transmitted to the first surface 102A through the carrier 112.

Referring to FIG. 4B providing a top view of the semiconductor manufacturing system 40, only the removing module 306 is visible. Under such arrangement, the removing module 306 and the acoustic wave generator 304 can be operated with independent rotation directions and different respective velocities.

Figure 5A:
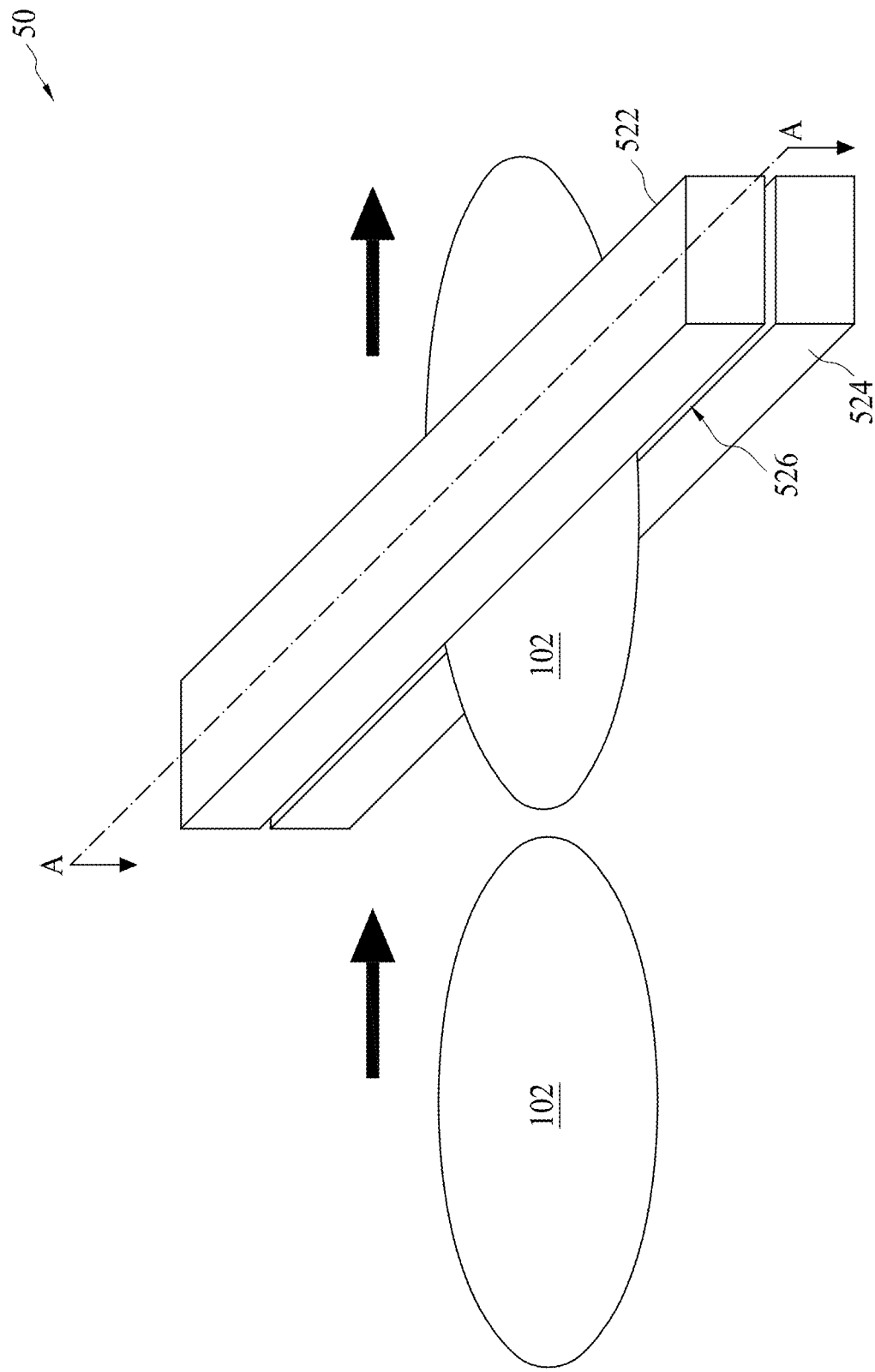
FIGS. 5A through 5C are schematic views of a particle cleaning apparatus in accordance with some embodiments of the present disclosure.

FIG. 5A is a schematic view of a particle cleaning apparatus 50 in accordance with some embodiments of the present disclosure. The particle cleaning apparatus 50 comprises a first arm 522 and a second arm 524 where a slit 526 is formed between the first arm 522 and the second arm 524. In a wafer cleaning process, a workpiece such as a wafer or semiconductor substrate 102, is passed through the slit 526. When the semiconductor substrate 102 is passed through the slit 526, portions are successively covered by the slit 526 and then cleaned. The foreign particles left on a top surface of the respective portion are removed.

Figure 5B:
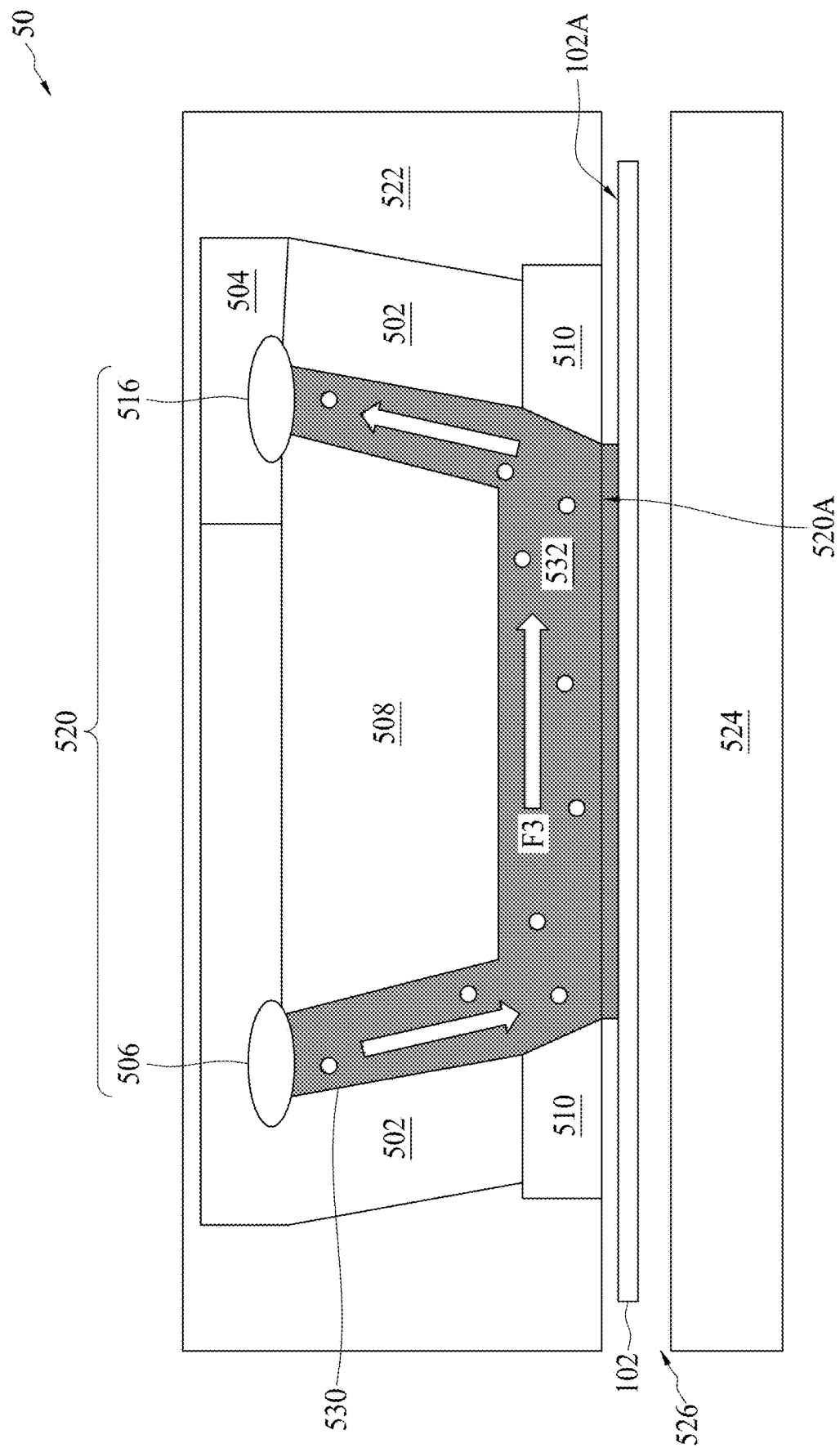

FIG. 5B is a sectional view of the particle cleaning apparatus 50 of FIG. 5A along the line AA', in accordance with some embodiments of the present disclosure. The particle cleaning apparatus 50 comprises a support 502, a removing module 504, apertures 506 and 516, an acoustic wave generator 508 and a retention cuff 510, all of which are included at least in the first arm 522 or the second arm 524.

A cavity 520 is formed in the first arm 522 and surrounded by the support 502, the aperture 506, the acoustic wave generator 508 and the particle cleaning module 504. In addition, the cavity 520 has an opening 520A adjacent to the slit 526 and facing the second arm 524. In addition, the acoustic wave generator 508 is disposed in the cavity 520. Accordingly, a fluid channel 530 is formed in the cavity 520. In an embodiment, the fluid channel 530 partially surrounds the acoustic wave generator 508, such as from a bottom side thereof. In an embodiment, the fluid channel 530 comprises the opening 520A. In an embodiment, the opening 520A is facing the semiconductor substrate 102, and thus the particles P are moved into the fluid channel 530 via the opening 520A. The fluid channel 530 comprises two ends connecting the apertures 506 and 516. The aperture 506 may be configured to supply a fluid onto the workpiece 102. Alternatively, the aperture 506 may be connected to a cleaning fluid source. In operation, the cleaning fluid 532 is injected into the fluid channel 530 from the aperture 506. Subsequently, the fluid 532 flows towards the slit 526 near the surface 102A of the semiconductor substrate 102. A flow F3 of the fluid 532 is generated at least by help of the acoustic wave generator 508 in order to direct the particles on the surface 102A. The fluid 532 and the particles P are drawn into the removing module 504 in response to the movement caused either by the acoustic wave from the acoustic wave generator 508 or the dragging force from the removing module 504.

In an embodiment, the acoustic wave generator 508 is disposed between the aperture 506 and the removing module 504. In an embodiment, at least a portion of the fluid channel 530 is in contact with the acoustic wave generator 508. The fluid 532 in the fluid channel 530 is directed by a flow F3. Furthermore, the particles P, upon leaving the surface 102A, are also taken away along the direction F3 substantially parallel to the surface 102A near the opening 520A. In an embodiment, the removing module 504 moves the fluid 532 on the surface 102A along a horizontal direction substantially parallel to the surface 102A. In an embodiment, at least around a central section of the opening 520A, the fluid 532 flows along a direction substantially aligned with the direction along which the fluid 532 is drawn away.

The retention cuff 510 surrounds the fluid channel 530 from a horizontal direction adjacent to the slit 526. The retention cuff 510 is configured to prevent the fluid 532 from overflowing out of the opening 520A of the fluid channel 530. In an embodiment, the retention cuff 510 is configured to prevent the fluid 532 from overflowing out of the first arm 522 or the second arm 524 from the slit 526.

Figure 5C:
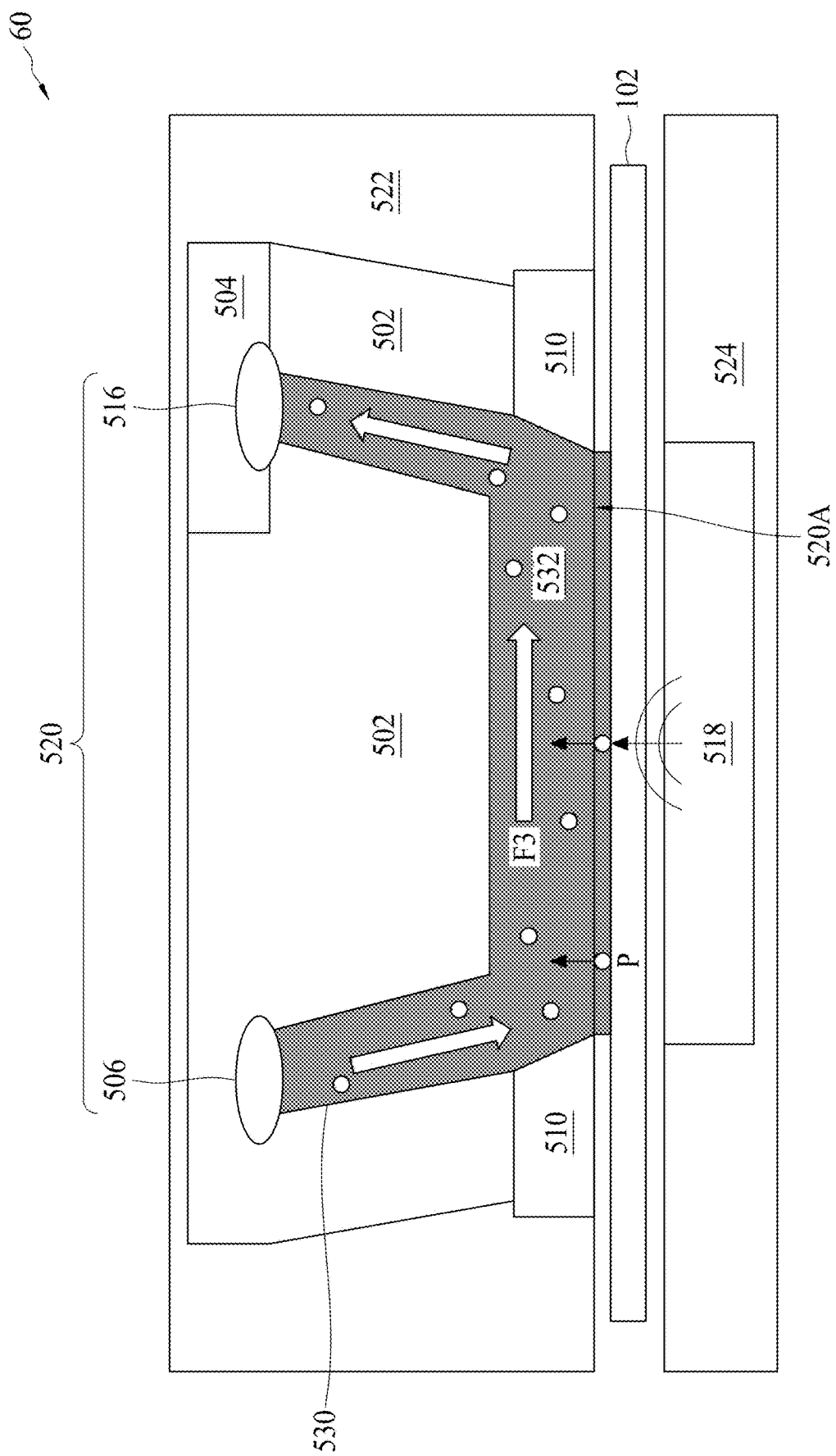

FIG. 5C is a sectional view of a particle cleaning apparatus 60 in accordance with some embodiments of the present disclosure. Referring to FIG. 5B and FIG. 5C, the fluid channel 530 is surrounded by the support 202. In addition, an acoustic wave generator 518 is disposed in the second arm 524. In an embodiment, the acoustic wave generator 518 is facing the opening 520A of the fluid channel 530 across the slit 526. In an embodiment, the acoustic wave generator 518 is in contact with the semiconductor substrate 102 or indirectly coupled thereto through an intervening material. The generated acoustic wave second arm 524 can be applied through the semiconductor substrate 102 towards the fluid 532 in the fluid channel 530. With such arrangement, geometry of the first arm 522 can be effectively reduced.

In the present embodiment, the acoustic wave is transmitted in a direction T from the second arm 524 toward the first arm 522. In addition, the particles P are removed off of the surface 102A and directed towards the fluid channel 530. In an embodiment, the direction T is substantially perpendicular to the slit 526 or the semiconductor substrate 102. Therefore, the arrangement of the acoustic wave generator 518 enables the propagation direction T of the acoustic wave substantially aligned with the moving direction of the particles that are moved off of the semiconductor substrate 102. Doing so further enhances the cleaning force exerted onto the particles.

Figure 6A:
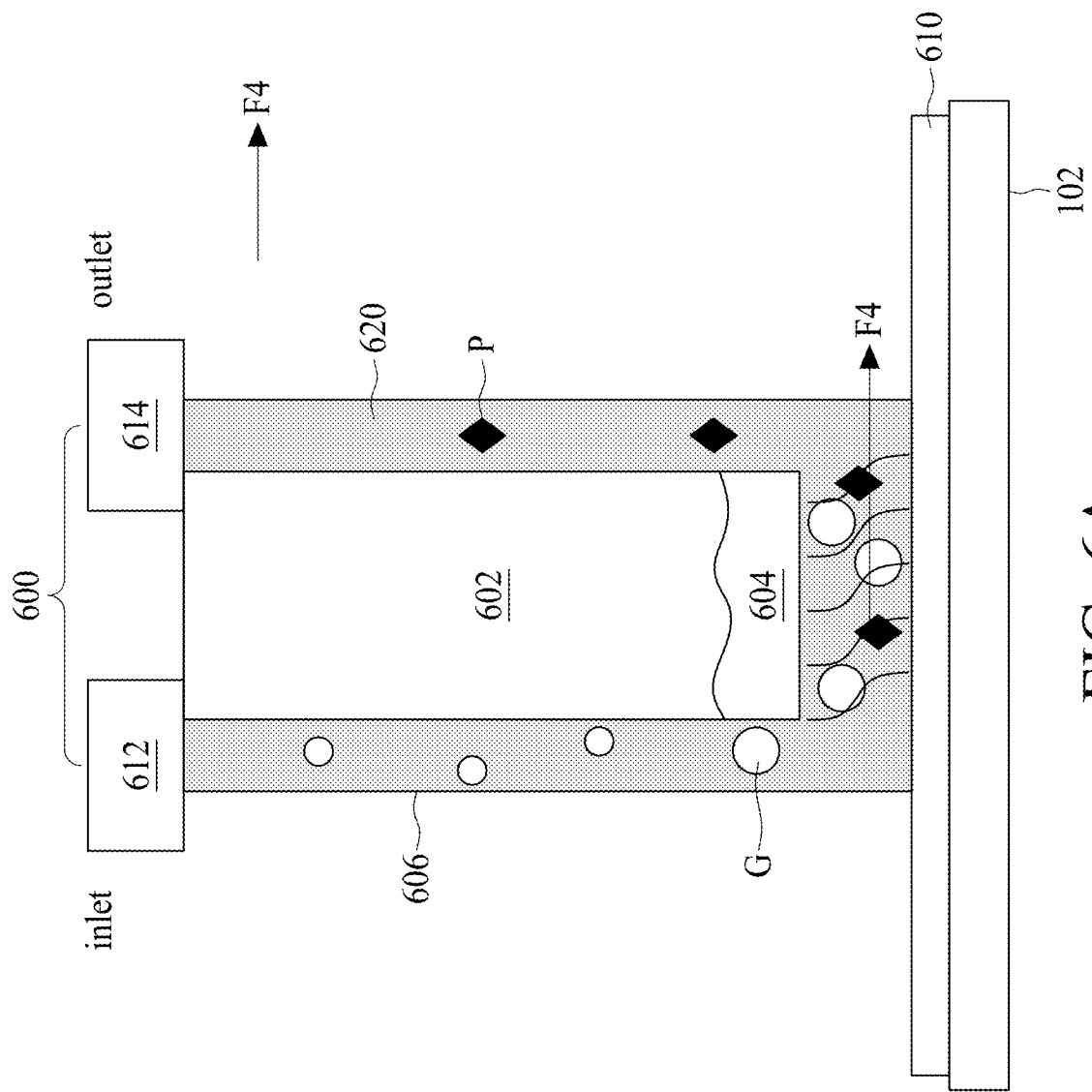
FIG. 6A is a schematic view of a particle cleaning apparatus in accordance with some embodiments of the present disclosure.

FIG. 6A is a schematic view of a particle cleaning apparatus 600 in accordance with some embodiments of the present disclosure. The particle cleaning apparatus 600 comprises a support 602, an acoustic wave generator 604, a removing module 614 and a fluid channel 606.

Referring to FIG. 6A, a workpiece 102, such as a semiconductor substrate or a platen, is provided to be cleaned. The particle cleaning apparatus 600 is disposed over the workpiece 102. In an embodiment, a first fluid 610 may be dispensed between the workpiece 102 and the particle cleaning apparatus 600. The first fluid 610 may comprise a same composition as the polishing fluid 120 in FIG. 1A. Alternatively, the first fluid 610 may be a cleaning fluid. In addition, the particle cleaning apparatus 600 comprises apertures configured to respectively receive and drain a second fluid 620.

The second fluid 620 may contain DI water and a dissolved gaseous material G such as oxygen, carbon dioxide and nitrogen. In an embodiment, the second fluid 620 is not of a polishing type and may not contain liquid chemicals or solid grains. In an embodiment, the particle cleaning apparatus 600 comprises a gas provider 612 coupled to the fluid channel 606 in order to provide the gaseous material G and mix the same with the second fluid 620.

The acoustic wave generator 604 is surrounded by the support 602 and the fluid channel 606. In the present embodiment, the removing module 614 may be coupled to the fluid channel 606. In the present embodiment, the particle cleaning apparatus 600 can be moved to scan the surface 102A in a direction F4. In addition, the second fluid 620 may be configured to flow in the direction F4 near a bottom portion of the fluid channel 606. In other words, the particle cleaning apparatus 600 is configured to move in a substantially same direction along with the fluid is move for carrying particles. The accumulated velocities of the particle cleaning apparatus 600 and the fluid flow may further enhance the cleaning performance.

The proposed particle cleaning apparatus and system possess several advantages. The particles, which are generated by wafer polishing or another semiconductor manufacturing operation and easily clung onto a surface, can be drawn away from the wafer surface with an acoustic wave. In addition, the particles included in the fluid can be cleaned off with the help of a removing force. In some embodiments, the removing module comprises a pump which provides a suction force to draw the fluid along with the particles. In some examples, the fluid is supplied in a direction substantially aligned with the direction along which the fluid is drawn away. Doing so further improves the cleaning efficiency of the particle removing apparatus.

The present disclosure provides a particle cleaning apparatus. The apparatus comprises an acoustic wave generator configured to apply an acoustic wave to particles external to the acoustic wave generator. The apparatus also includes a removing module configured to remove the applied particles.

The present disclosure provides a semiconductor manufacturing system. The system comprises a platen, an acoustic wave generator configured to generate an acoustic wave around the platen, and a removing module configured to draw particles off of the platen.

The present disclosure provides an apparatus for cleaning particles. The apparatus comprises an aperture configured to supply a fluid onto a workpiece, an acoustic wave generator configured to apply an acoustic wave onto the fluid, and a removing module configured to draw the fluid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for cleaning particles, the apparatus comprising:
    an aperture configured to supply a fluid onto a workpiece;
    an acoustic wave generator disposed on a first side of the workpiece and configured to apply an acoustic wave onto the fluid;
    a removing module disposed on the first side of the workpiece and configured to draw the fluid; and
    a first arm and a second arm forming a casing including the aperture, the acoustic wave generator and the removing module,
        wherein at least one of the first arm and the second arm covers an entirety of the workpiece from a cross-sectional view,
        wherein the first arm further defines a fluid channel containing the fluid and comprises a retention cuff laterally surrounding the fluid channel and facing the workpiece, wherein the retention cuff comprises an air inlet and an air outlet to generate an air barrier in a gap between the retention cuff and the workpiece to prevent the fluid from flowing out of the fluid channel.

2. The apparatus of claim 1, wherein the apparatus further comprises a slit defined by the first arm and the second arm and configured to allow the workpiece to pass through.

3. The apparatus of claim 1, wherein the first arm and the second arm are aligned with each other from a top-view perspective.

4. The apparatus of claim 1, wherein the fluid channel is in fluid communication with the removing module and configured to receive the fluid from the aperture.

5. The apparatus of claim 4, wherein the fluid channel comprises an opening facing the workpiece, and the particles on the workpiece are drawn into the fluid via the opening.

6. The apparatus of claim 4, wherein the acoustic wave generator is at least partially surrounded by the fluid channel.

7. The apparatus of claim 1, wherein the removing module is configured to move the fluid along at least a horizontal direction substantially parallel to a top surface of the workpiece.

8. The apparatus of claim 1, wherein the acoustic wave generator is configured to generate an acoustic wave with a direction substantially aligned with a moving direction of the particles drawn away from the workpiece.

9. The apparatus of claim 1, further comprising a gas generator configured to generate a gaseous material and mix the gas material with the fluid.

10. An apparatus for cleaning particles, the apparatus comprising a first arm and a second arm facing the first arm, wherein at least one of the first arm and the second arm comprises:
an acoustic wave generator disposed over a first side of a workpiece in the first arm and configured to apply an acoustic wave onto the workpiece;
a removing module configured to draw a fluid from the workpiece;
a retention cuff coupled to the removing module; and
a fluid channel in fluid communication with the removing module,
wherein the first arm and the second arm are disposed entirely overlapping each other from a top-view perspective,
wherein the fluid channel comprises a bottom portion between the acoustic wave generator and the workpiece, and the bottom portion of the fluid channel is parallel to a surface of the workpiece, wherein the bottom portion of the fluid channel is completely and laterally enclosed within the retention cuff.

11. The apparatus of claim 10, wherein each of the first arm and the second arm comprises a first side having a length greater than a diameter of the workpiece and a second side, connected to the first side, having a length less than the diameter of the workpiece.

12. The apparatus of claim 10, wherein the retention cuff coupled to the removing module and is disposed on a surface of the first arm facing the second arm.

13. The apparatus of claim 12, wherein the retention cuff comprises an inner sidewall defining the bottom portion of the fluid channel between the workpiece and the removing module.

14. The apparatus of claim 13, wherein the retention cuff further comprises an outer sidewall surrounding the inner sidewall and having a diameter less than a diameter of the workpiece, wherein the retention cuff is configured to generate an air barrier directly over the workpiece to prevent the fluid from flowing out of the first arm and the second arm.

15. The apparatus of claim 14, wherein the retention cuff comprises a bottom surface connecting the outer sidewall to the inner sidewall, the bottom surface facing the second arm.

16. The apparatus of claim 12, wherein the first arm and the second arm further defines a slit through which the workpiece is configured to move during a cleaning operation, wherein the fluid channel comprises an opening in communication with the slit, and the acoustic wave generator is aligned with the opening.

17. The apparatus of claim 16, wherein the acoustic wave generator and the opening are disposed on opposite sides of the slit.

18. The apparatus of claim 12, wherein the fluid channel is further defined by the acoustic wave generator.

19. The apparatus of claim 10, wherein each of the first arm and the second arm comprises a cuboid shape.

20. An apparatus for cleaning particles, comprising:
a casing formed by a first arm and a second arm, wherein a slit, defined between a first surface of the first arm and a second surface of the second arm facing the first surface, is configured to allow a workpiece to pass through in a cleaning operation;
an aperture formed in the first arm and configured to supply a fluid;
a fluid channel included in the first arm and configured to contain the fluid, the fluid channel comprising an opening on the first surface;
an acoustic wave generator disposed in the second arm and configured to apply an acoustic wave onto the workpiece and the fluid;
a retention cuff facing the slit and surrounding the opening, the retention cuff comprising a bottom surface coplanar with the first surface; and
a removing module disposed in the first arm and in fluid communication with the fluid channel, the removing module being configured to draw the fluid through the fluid channel,
wherein the retention cuff comprises an air inlet and an air outlet to generate an air barrier in a gap between the retention cuff and the workpiece to prevent the fluid from flowing out of the fluid channel.

* * * * *